(12) United States Patent
Zacharias et al.

(10) Patent No.: US 10,397,377 B2
(45) Date of Patent: Aug. 27, 2019

(54) DATA COMPRESSION FOR CELLULAR INTERNET OF THINGS (CIOT)

(71) Applicant: QUALCOMM Incorporated, San Diego, CA (US)

(72) Inventors: Leena Zacharias, San Jose, CA (US); Srinivasan Balasubramanian, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 63 days.

(21) Appl. No.: 15/469,086

(22) Filed: Mar. 24, 2017

(65) Prior Publication Data

US 2017/0279934 A1    Sep. 28, 2017

Related U.S. Application Data

(60) Provisional application No. 62/313,793, filed on Mar. 27, 2016.

(51) Int. Cl.
| | |
|---|---|
| *H04L 29/06* | (2006.01) |
| *H04L 29/12* | (2006.01) |
| *H04L 12/879* | (2013.01) |
| *H04W 4/00* | (2018.01) |
| *H04W 28/06* | (2009.01) |
| *H03M 7/30* | (2006.01) |
| *H04W 4/70* | (2018.01) |

(52) U.S. Cl.
CPC .......... *H04L 69/04* (2013.01); *H03M 7/6064* (2013.01); *H04L 49/901* (2013.01); *H04L 61/2007* (2013.01); *H04L 69/22* (2013.01); *H04W 4/70* (2018.02); *H04W 28/06* (2013.01); *H03M 7/3088* (2013.01)

(58) Field of Classification Search
None
See application file for complete search history.

(56) References Cited

U.S. PATENT DOCUMENTS

| | | | | |
|---|---|---|---|---|
| 6,081,783 A | * | 6/2000 | Divine | ............... H03M 7/30 704/201 |
| 9,495,378 B2 | | 11/2016 | Sundaram et al. | |
| 2002/0018010 A1 | * | 2/2002 | Le | ............... H04L 29/06 341/60 |
| 2002/0058501 A1 | | 5/2002 | Hannu et al. | |

(Continued)

FOREIGN PATENT DOCUMENTS

WO    WO-2016171959 A1    10/2016

OTHER PUBLICATIONS

International Search Report and Written Opinion—PCT/US2017/024191—ISA/EPO—Jul. 17, 2017.

*Primary Examiner* — Candal Elpenord
(74) *Attorney, Agent, or Firm* — Dalei Dong; Patterson & Sheridan LLP

(57) ABSTRACT

Aspects of the present disclosure provide techniques for compressing data packets for cellular internet of things (CIoT) communications. An example method generally includes establishing at least one prefill buffer common to one or more UEs, wherein the prefill buffer includes a plurality of common strings, generating a compressed packet by finding matches to the common strings in at least one of a header portion or payload portion of the packet and associating identifiers with the common strings, and transmitting the packet.

28 Claims, 9 Drawing Sheets

(56) References Cited

U.S. PATENT DOCUMENTS

| | | | |
|---|---|---|---|
| 2006/0098603 A1* | 5/2006 | Cave | H04L 41/147 370/335 |
| 2007/0195815 A1* | 8/2007 | Turner | H04L 47/10 370/465 |
| 2010/0017526 A1* | 1/2010 | Jagannath | H04L 12/1859 709/229 |
| 2011/0010607 A1* | 1/2011 | Raveendran | H04L 1/0067 714/776 |
| 2014/0314088 A1 | 10/2014 | Li et al. | |
| 2015/0063374 A1* | 3/2015 | Venkatachalam Jayaraman | H04L 69/04 370/476 |
| 2015/0256453 A1* | 9/2015 | Laraqui | H04L 45/74 370/392 |
| 2016/0337255 A1 | 11/2016 | Balasubramanian et al. | |

* cited by examiner

DATA COMPRESSION FOR CELLULAR INTERNET OF THINGS (CIOT)

CROSS-REFERENCE TO RELATED APPLICATIONS

This application claims benefit of U.S. Provisional Patent Application Ser. No. 62/313,793, entitled "Data Compression for Cellular Internet of Things (CIoT)," filed Mar. 27, 2016 and assigned to the assignee hereof, the contents of which are herein incorporated by reference in its entirety.

BACKGROUND

Field

Aspects of the present disclosure relate generally to wireless communications and, more particularly, to techniques for performing data compression for Cellular Internet of Things (CIoT).

Background

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems, 3rd Generation Partnership Project (3GPP) Long Term Evolution (LTE) systems and orthogonal frequency division multiple access (OFDMA) systems.

Generally, a wireless multiple-access communication system can simultaneously support communication for multiple wireless terminals. Each terminal communicates with one or more base stations via transmissions on the forward and reverse links. The forward link (or downlink) refers to the communication link from the base stations to the terminals, and the reverse link (or uplink) refers to the communication link from the terminals to the base stations. This communication link may be established via a single-input single-output, multiple-input single-output or a multiple-input multiple-output (MIMO) system.

A MIMO system employs multiple (NT) transmit antennas and multiple (NR) receive antennas for data transmission. A MIMO channel formed by the NT transmit and NR receive antennas may be decomposed into NS independent channels, which are also referred to as spatial channels. Each of the NS independent channels corresponds to a dimension. The MIMO system can provide improved performance (e.g., higher throughput and/or greater reliability) if the additional dimensionalities created by the multiple transmit and receive antennas are utilized.

A user equipment (UE) may be located within the coverage of multiple wireless networks, which may support different communication services. A suitable wireless network may be selected to serve the UE based on one or more criteria. The selected wireless network may be unable to provide a desired communication service (e.g., voice service) for the UE. A set of procedures may then be performed to redirect the UE to another wireless network (e.g., 2G, 3G or non-LTE 4G) that can provide the desired communication service.

SUMMARY

In an aspect of the disclosure, a method for wireless communications is provided. The method generally includes establishing at least one prefill buffer common to one or more UEs, wherein the prefill buffer includes common strings, generating a compressed packet by finding matches to the common strings in at least one of a header portion or payload portion of the packet and associating identifiers with the common strings, and transmitting the packet.

In an aspect of the disclosure, a method for wireless communications is provided. The method generally includes receiving a compressed packet, wherein the packet includes at least one identifier corresponding to a common string, and processing the packet by retrieving the common string from a prefill buffer common to one or more UEs using the identifier.

In an aspect of the disclosure, an apparatus for wireless communications is provided. The apparatus generally includes a processing system configured to establish at least one prefill buffer common to one or more UEs, wherein the prefill buffer includes common strings, generating a compressed packet by finding matches to the common strings in at least one of a header portion or payload portion of the packet and associating identifiers with the common strings, and a transmitter configured to transmit the packet In an aspect of the disclosure, an apparatus for wireless communications is provided. The apparatus generally includes a receiver configured to receive a compressed packet, wherein the packet includes at least one identifier corresponding to a common string, and a processing system configured to process the packet by retrieving the common string from a prefill buffer common to one or more UEs using the identifier.

In an aspect of the disclosure, an apparatus for wireless communications is provided. The apparatus generally includes means for establishing at least one prefill buffer common to one or more UEs, wherein the prefill buffer includes common strings, means for generating a compressed packet by finding matches to the common strings in at least one of a header portion or payload portion of the packet and associating identifiers with the common strings, and means for transmitting the packet In an aspect of the disclosure, an apparatus for wireless communications is provided. The apparatus generally includes means for receiving a compressed packet, wherein the packet includes at least one identifier corresponding to a common string, and means for processing the packet by retrieving the common string from a prefill buffer common to one or more UEs using the identifier.

In an aspect of the disclosure, a computer-readable medium is provided. The computer-readable medium generally includes instructions which, when executed on one or more processors, performs an operation comprising establishing at least one prefill buffer common to one or more UEs, wherein the prefill buffer includes common strings, generating a compressed packet by finding matches to the common strings in at least one of a header portion or payload portion of the packet and associating identifiers with the common strings, and transmitting the packet.

In an aspect of the disclosure, a computer-readable medium is provided. The computer-readable medium generally includes instructions which, when executed on one or more processors, performs an operation comprising receiving a compressed packet, wherein the packet includes at least one identifier corresponding to a common string, and processing the packet by retrieving the common string from a prefill buffer common to one or more UEs using the identifier.

Numerous other aspects are provided including methods, apparatus, systems, computer program products, and processing systems.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Techniques and apparatus are provided herein for compressing data packets for communications with cellular internet of things (CIoT) devices. By compressing header and/or payload content of a data packet in communications with CIoT devices, transmitting devices can reduce the amount of overhead used in communicating with devices via small and infrequent data packets.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The techniques described herein may be used for various wireless communication networks such as code division multiple access (CDMA), time division multiple access (TDMA), frequency division multiple access (FDMA), orthogonal FDMA (OFDMA), single carrier FDMA (SC-FDMA) and other networks. The terms "network" and "system" are often used interchangeably. A CDMA network may implement a radio access technology (RAT) such as universal terrestrial radio access (UTRA), cdma2000, etc. UTRA includes wideband CDMA (WCDMA) and other variants of CDMA. cdma2000 covers IS-2000, IS-95 and IS-856 standards. IS-2000 is also referred to as 1× radio transmission technology (1×RTT), CDMA2000 1×, etc. A TDMA network may implement a RAT such as global system for mobile communications (GSM), enhanced data rates for GSM evolution (EDGE), or GSM/EDGE radio access network (GERAN). An OFDMA network may implement a RAT such as evolved UTRA (E-UTRA), ultra mobile broadband (UMB), IEEE 802.11 (Wi-Fi), IEEE 802.16 (WiMAX), IEEE 802.20, Flash-OFDM®, etc. UTRA and E-UTRA are part of universal mobile telecommunication system (UMTS). 3GPP long-term evolution (LTE) and LTE-Advanced (LTE-A) are new releases of UMTS that use E-UTRA, which employs OFDMA on the downlink and SC-FDMA on the uplink. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and RATs mentioned above as well as other wireless networks and RATs.

Figure 1:
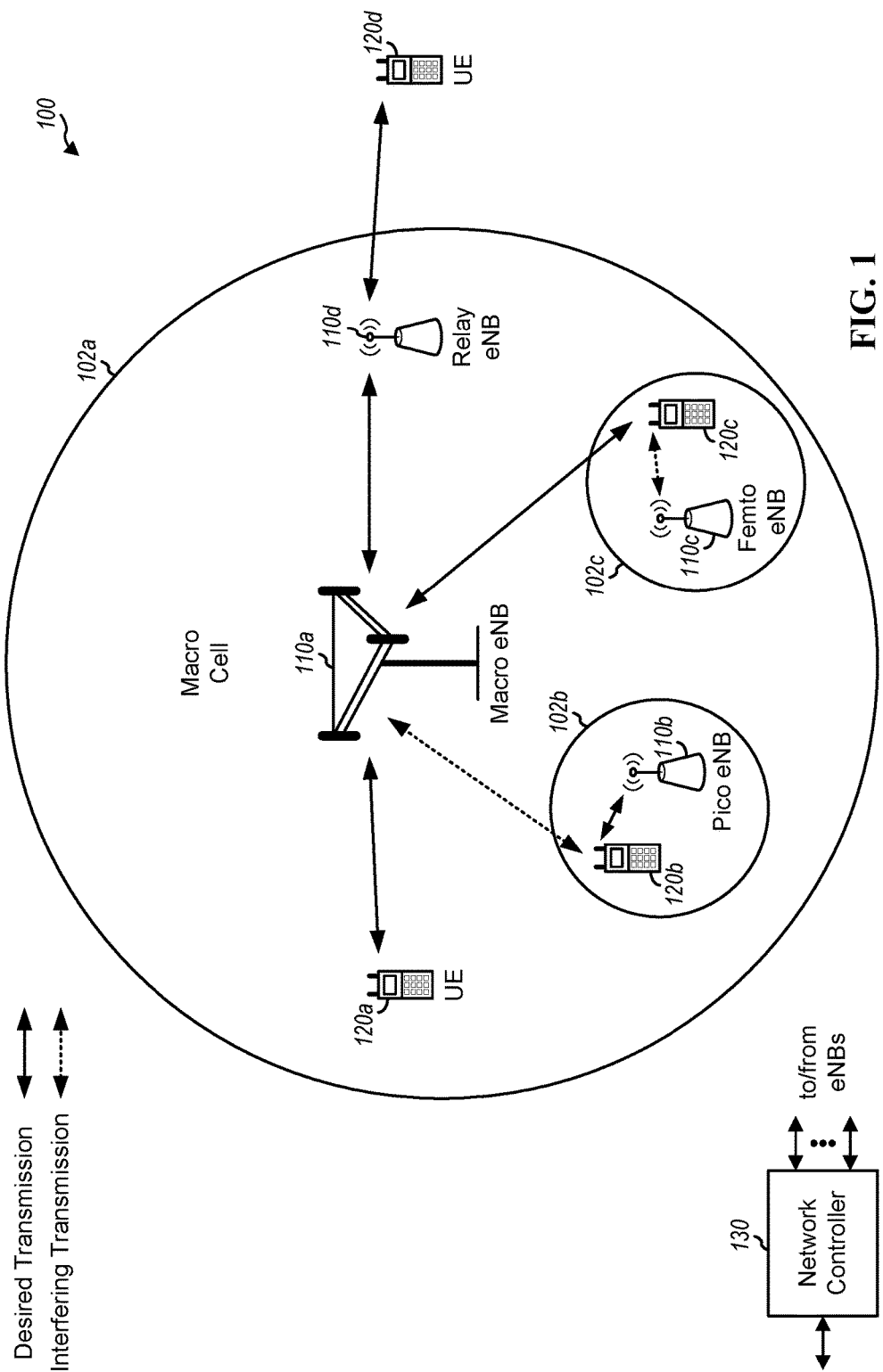
FIG. 1 illustrates an exemplary deployment in which multiple wireless networks have overlapping coverage, in accordance with certain aspects of the present disclosure.

FIG. 1 shows an exemplary deployment in which multiple wireless networks have overlapping coverage. An evolved universal terrestrial radio access network (E-UTRAN) 120 may support LTE and may include a number of evolved Node Bs (eNBs) 122 and other network entities that can support wireless communication for user equipments 110 (UEs). Each eNB 122 may provide communication coverage for a particular geographic area. The term "cell" can refer to a coverage area of an eNB and/or an eNB subsystem serving this coverage area. A serving gateway (S-GW) 124 may communicate with E-UTRAN 120 and may perform various functions such as packet routing and forwarding, mobility anchoring, packet buffering, initiation of network-triggered services, etc. A mobility management entity (MME) 126 may communicate with E-UTRAN 120 and serving gateway 124 and may perform various functions such as mobility management, bearer management, distribution of paging messages, security control, authentication, gateway selection, etc. The network entities in LTE are described in 3GPP TS 36.300, entitled "Evolved Universal Terrestrial Radio Access (E-UTRA) and Evolved Universal Terrestrial Radio Access Network (E-UTRAN); Overall description," which is publicly available.

A radio access network (RAN) 130 may support GSM and may include a number of base stations 132 and other network entities that can support wireless communication for UEs. A mobile switching center (MSC) 134 may communicate with the RAN 130 and may support voice services, provide routing for circuit-switched calls, and perform mobility management for UEs located within the area served by MSC 134. Optionally, an inter-working function (IWF) 140 may facilitate communication between MME 126 and MSC 134 (e.g., for 1×CSFB).

E-UTRAN 120, serving gateway 124, and MME 126 may be part of an LTE network 102. RAN 130 and MSC 134 may be part of a GSM network 104. For simplicity, FIG. 1 shows only some network entities in the LTE network 102 and the GSM network 104. The LTE and GSM networks may also include other network entities that may support various functions and services.

In general, any number of wireless networks may be deployed in a given geographic area. Each wireless network may support a particular RAT and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs.

A UE 110 may be stationary or mobile and may also be referred to as a mobile station, a terminal, an access terminal, a subscriber unit, a station, etc. UE 110 may be a cellular phone, a personal digital assistant (PDA), a wireless modem, a wireless communication device, a handheld device, a laptop computer, a cordless phone, a wireless local loop (WLL) station, etc.

Upon power up, UE 110 may search for wireless networks from which it can receive communication services. If more than one wireless network is detected, then a wireless network with the highest priority may be selected to serve UE 110 and may be referred to as the serving network. UE 110 may perform registration with the serving network, if necessary. UE 110 may then operate in a connected mode to actively communicate with the serving network. Alternatively, UE 110 may operate in an idle mode and camp on the serving network if active communication is not required by UE 110.

UE 110 may be located within the coverage of cells of multiple frequencies and/or multiple RATs while in the idle mode. For LTE, UE 110 may select a frequency and a RAT to camp on based on a priority list. This priority list may include a set of frequencies, a RAT associated with each frequency, and a priority of each frequency. For example, the priority list may include three frequencies X, Y and Z. Frequency X may be used for LTE and may have the highest priority, frequency Y may be used for GSM and may have the lowest priority, and frequency Z may also be used for GSM and may have medium priority. In general, the priority list may include any number of frequencies for any set of RATs and may be specific for the UE location. UE 110 may be configured to prefer LTE, when available, by defining the priority list with LTE frequencies at the highest priority and with frequencies for other RATs at lower priorities, e.g., as given by the example above.

UE 110 may operate in the idle mode as follows. UE 110 may identify all frequencies/RATs on which it is able to find a "suitable" cell in a normal scenario or an "acceptable" cell in an emergency scenario, where "suitable" and "acceptable" are specified in the LTE standards. UE 110 may then camp on the frequency/RAT with the highest priority among all identified frequencies/RATs. UE 110 may remain camped on this frequency/RAT until either (i) the frequency/RAT is no longer available at a predetermined threshold or (ii) another frequency/RAT with a higher priority reaches this threshold. This operating behavior for UE 110 in the idle mode is described in 3GPP TS 36.304, entitled "Evolved Universal Terrestrial Radio Access (E-UTRA); User Equipment (UE) procedures in idle mode," which is publicly available.

UE 110 may be able to receive packet-switched (PS) data services from LTE network 102 and may camp on the LTE network while in the idle mode. LTE network 102 may have limited or no support for voice-over-Internet protocol (VoIP), which may often be the case for early deployments of LTE networks. Due to the limited VoIP support, UE 110 may be transferred to another wireless network of another RAT for voice calls. This transfer may be referred to as circuit-switched (CS) fallback. UE 110 may be transferred to a RAT that can support voice service such as 1×RTT, WCDMA, GSM, etc. For call origination with CS fallback, UE 110 may initially become connected to a wireless network of a source RAT (e.g., LTE) that may not support voice service. The UE may originate a voice call with this wireless network and may be transferred through higher-layer signaling to another wireless network of a target RAT that can support the voice call. The higher-layer signaling to transfer the UE to the target RAT may be for various procedures, e.g., connection release with redirection, PS handover, etc.

As described in greater detail below, in some embodiments, the Node Bs 110 may implement the functionality described herein for improving user experience of a voice call associated with a device, such as simultaneous voice and long-term evolution (SV-LTE) device, (e.g., improving silent redial in mobile originated calls). For example, a Node B may detect failures during mobile originated calls from a UE and may redirect the UE to another system in an effort to speed up a silent redial procedure.

As described in greater detail below, in some embodiments, the UEs 120 may implement the functionality described herein for improving user experience of a voice call associated with a device, such as a simultaneous voice and long-term evolution (SV-LTE) device, (e.g., improving silent redial in mobile originated calls). For example, the UE may maintain timers, counts, and/or thresholds for use in silent redial. UE 120 may also detect a failure during mobile originated call, determine how to attempt retrying the call, select a subsequent system for attempting the call, and attempt to retry the call as described herein.

Figure 2:
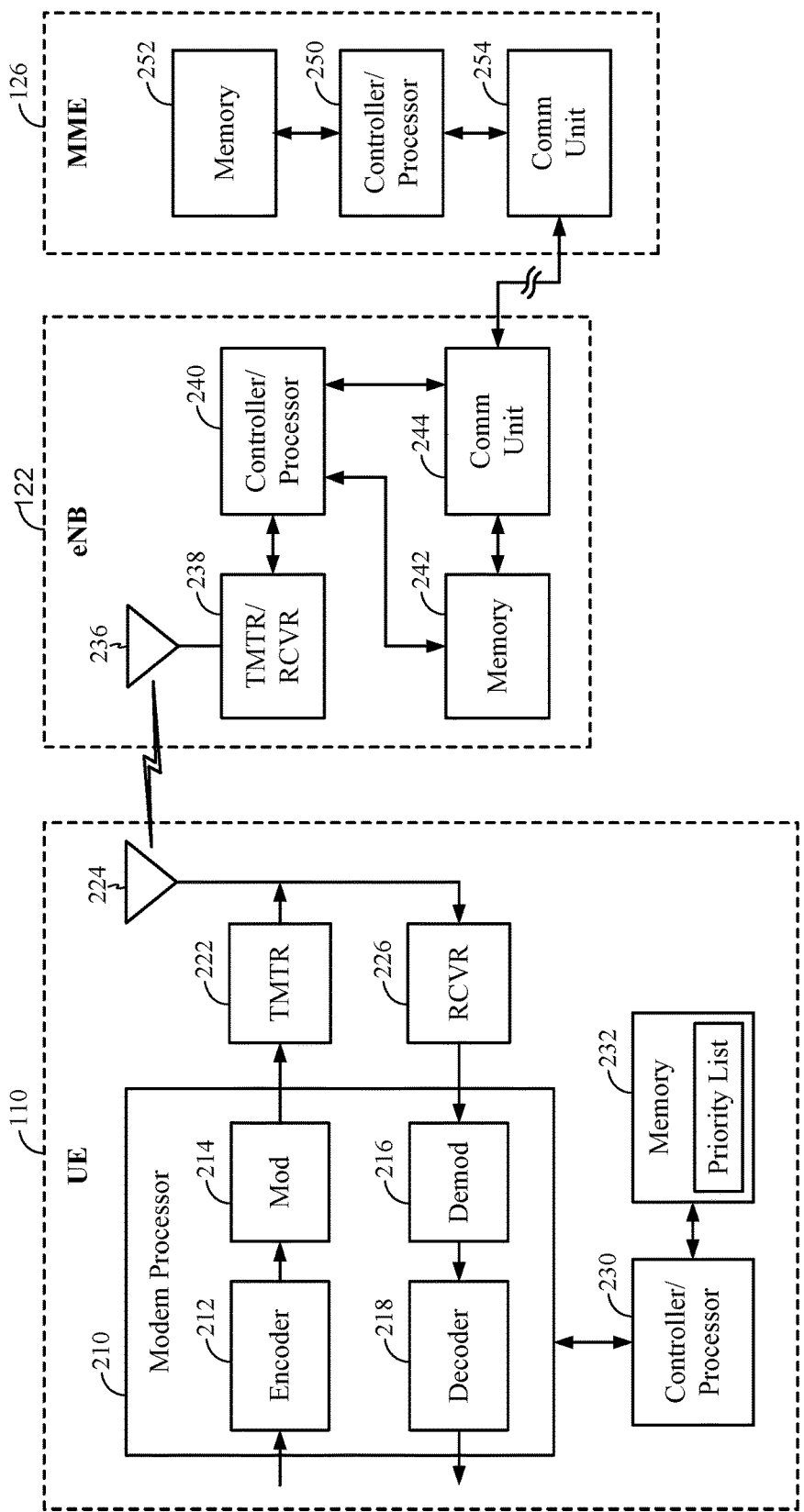
FIG. 2 shows a block diagram conceptually illustrating an example of a base station in communication with a user equipment (UE) in a wireless communications network, in accordance with certain aspects of the present disclosure.

FIG. 2 shows a block diagram of a design of UE 110, eNB 122, and MME 126 in FIG. 1. At UE 110, an encoder 212 may receive traffic data and signaling messages to be sent on the uplink. Encoder 212 may process (e.g., format, encode, and interleave) the traffic data and signaling messages. A modulator (Mod) 214 may further process (e.g., symbol map and modulate) the encoded traffic data and signaling messages and provide output samples. A transmitter (TMTR) 222 may condition (e.g., convert to analog, filter, amplify, and frequency upconvert) the output samples and generate an uplink signal, which may be transmitted via an antenna 224 to eNB 122.

On the downlink, antenna 224 may receive downlink signals transmitted by eNB 122 and/or other eNBs/base stations. A receiver (RCVR) 226 may condition (e.g., filter, amplify, frequency downconvert, and digitize) the received signal from antenna 224 and provide input samples. A demodulator (Demod) 216 may process (e.g., demodulate) the input samples and provide symbol estimates. A decoder 218 may process (e.g., deinterleave and decode) the symbol estimates and provide decoded data and signaling messages sent to UE 110. Encoder 212, modulator 214, demodulator 216, and decoder 218 may be implemented by a modem processor 210. These units may perform processing in accordance with the RAT (e.g., LTE, 1×RTT, etc.) used by the wireless network with which UE 110 is in communication.

A controller/processor 230 may direct the operation at UE 110. Controller/processor 230 may also perform or direct other processes for the techniques described herein. Controller/processor 230 may also perform or direct the processing by UE. Memory 232 may store program codes and data for UE 110. Memory 232 may also store a priority list and configuration information.

At eNB 122, a transmitter/receiver 238 may support radio communication with UE 110 and other UEs. A controller/processor 240 may perform various functions for communication with the UEs. On the uplink, the uplink signal from UE 110 may be received via an antenna 236, conditioned by receiver 238, and further processed by controller/processor 240 to recover the traffic data and signaling messages sent by UE 110. On the downlink, traffic data and signaling messages may be processed by controller/processor 240 and conditioned by transmitter 238 to generate a downlink signal, which may be transmitted via antenna 236 to UE 110 and other UEs. Controller/processor 240 may also perform or direct other processes for the techniques described herein. Controller/processor 240 may also perform or direct the processing by eNB 122. Memory 242 may store program codes and data for the base station. A communication (Comm) unit 244 may support communication with MME 126 and/or other network entities.

Figure 3:
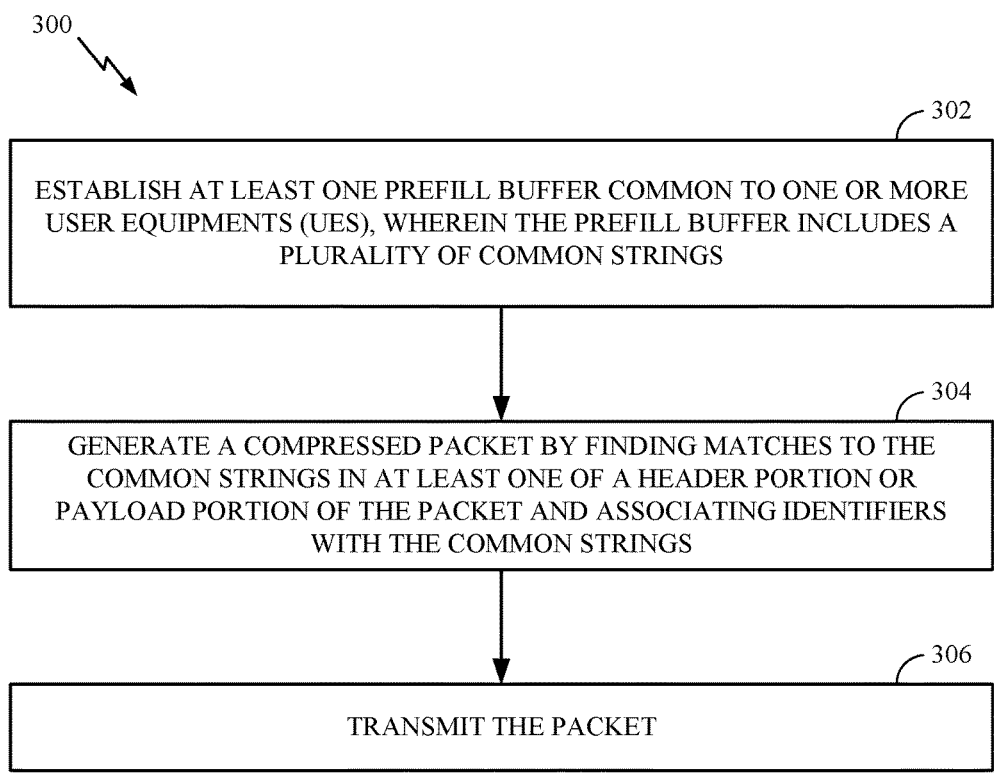
FIG. 3 illustrates example operations that may be performed to generate and transmit a compressed packet, in accordance with certain aspects of the present disclosure.

In some cases, controller/processor 230 and/or controller/processor 240 may be configured to perform techniques presented herein to detect and recover from sequence number de-synchronization (e.g., operations 300 shown in FIG. 3).

At MME 126, a controller/processor 250 may perform various functions to support communication services for UEs. Controller/processor 250 may also perform or direct the processing by MME 126 in FIGS. 3 and 4. Memory 252 may store program codes and data for MME 126. A communication unit 254 may support communication with other network entities.

FIG. 2 shows simplified designs of UE 110, eNB 122, and MME 126. In general, each entity may include any number of transmitters, receivers, processors, controllers, memories, communication units, etc. Other network entities may also be implemented in similar manner.

Example Data Compression for Cellular Internet of Things (CIoT)

Aspects of the present disclosure provide techniques for compressing header and/or payload portions of data packets transmitted between cellular internet of things (CIoT) devices. By compressing header and/or payload portions of data packets in CIoT communications, overhead can be reduced relative to an uncompressed packet.

In some cases, packet header and/or payload can be compressed based on the contents of a prefill buffer preloaded at the compressor and decompressor. The prefill buffer may include common strings and may associate each common string with an identifier, such as a memory address (pointer) or other identifier. When a transmitting device (e.g., a CIoT UE or CIoT serving gateway node) generates a packet for transmission, the transmitting device can replace matched strings stored in the prefill buffer with the associated identifier to generate a compressed packet. On receipt of the compressed packet, the receiving device can refer to the prefill buffer to replace an identifier carried in the compressed packet with the associated common string from the prefill buffer. By replacing strings with shorter identifiers, the size of a packet header and/or payload may be reduced.

In CIoT, compressed packets may be transmitted in non-access stratum (NAS) data protocol data units (PDUs). Because NAS PDUs are generally encrypted, transmitting devices can compress the data carried in a packet before the packet is encapsulated into an NAS PDU and transmitted. For CIoT data, which may have a small data size (e.g., 20-200 bytes) and may be transmitted infrequently, transmitting uncompressed data can impose additional overhead. Additionally, configuring CIoT UEs to use a particular prefill buffer regularly (e.g., via radio resource control (RRC) signaling) may increase transmission overhead.

To reduce an amount of overhead for CIoT communications, aspects of the present disclosure provide techniques for using prefill buffers common to one or more UEs to store commonly-transmitted strings. As discussed in further detail herein, transmitting devices can use the prefill buffers common to one or more UEs to replace commonly transmitted strings with one or more identifiers (e.g., pointers to the string in a prefill buffer) and reduce the size of a transmitted packet. Meanwhile, receiving devices can use an indication that a received packet is compressed and the prefill buffers common to one or more UEs to replace the one or more identifiers in the received, compressed packet with the one or more common strings associated with the identifiers included in the received packet. In some cases, the transmitting and receiving devices need not engage in packet exchanges prior to transmission and reception of compressed packets (e.g., transmission of one or more packets including a prefill buffer to be used by a transmitting device for generating compressed packets for transmission) in order to enable data compression for CIoT communications.

FIG. 3 illustrates example operations that may be performed by a transmitting device to generate and transmit a compressed packet, according to an embodiment. As illustrated, operations 300 begin at 302, where a transmitting device establishes at least one prefill buffer common to one or more user equipments (UEs). The prefill buffer generally includes common strings and may include associations to corresponding identifiers.

At 304, the transmitting device generates a compressed packet. The compressed packet generally includes one or more of the identifiers in at least one of a header portion or a payload portion of the packet. As discussed herein, the compressed packet can include an identifier in place of a longer string, which can reduce the size of the compressed packet relative to an uncompressed packet in which common strings are not replaced by the corresponding identifier in a prefill buffer. In generating the compressed packet, the transmitting device can find matches to common strings in the prefill buffer with data in the header and/or payload of the packet, associate an identifier to each of the common strings found in the header and/or payload of the packet, and replace the common strings with the associated identifiers. At 306, the transmitting device transmits the packet. As discussed, the packet may be encapsulated in an NAS PDU for transmission.

Figure 4:
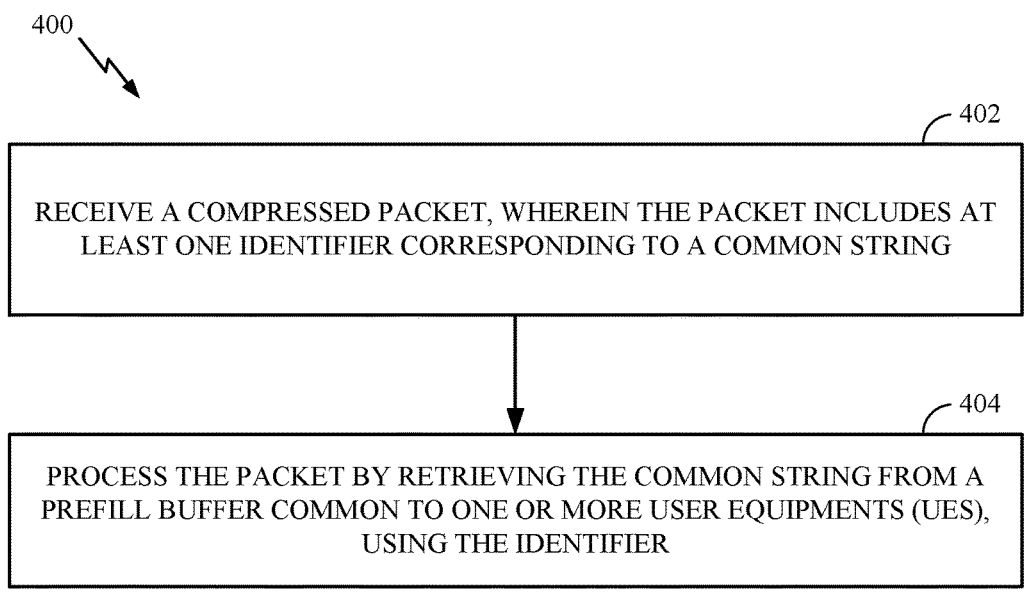
FIG. 4 illustrates example operations that may be performed to receive and decompress a compressed packet, in accordance with certain aspects of the present disclosure.

FIG. 4 illustrates example operations that may be performed by a receiving device to receive and decompress a compressed packet, according to an embodiment. As illustrated, operations 400 begin at 402, where a receiving device receives a compressed packet. The packet generally includes at least one identifier corresponding to a common string.

At 404, the receiving device processes the packet. To process the packet, the receiving device retrieves the common string from a prefill buffer common to one or more user equipments (UEs) using the identifier.

To generate compressed packets for CIoT, one or more prefill buffers may be established at a CIoT serving gateway node (C-SGN), which may include a mobile management entity (MME) for CIoT devices. These prefill buffers may be common to a plurality of UEs. By maintaining prefill buffers at a C-SGN for a plurality of UEs, the C-SGN need not maintain a compression context for each UE (e.g., need not track the prefill buffer used for communications with each UE). During a UE attach procedure, a C-SGN can identify the prefill buffer to use for compressing and decompressing packets, and the UE and C-SGN may use the identified prefill buffer to compress and decompress packets while the UE is attached to the C-SGN. The identification of the prefill buffer to be used for compressing and decompressing packets may be, for example, a checksum or other unique identifier (e.g., a Universally Unique Identifier, or UUID) associated with the specific prefill buffer. In some cases, the UE and C-SGN may exchange the identification of the prefill buffer upon establishing a connection and need not exchange additional packets beyond an identification of the prefill buffer to be used for compression and decompression of packets in order for the UE and C-SGN to transmit and receive compressed packets.

In some cases, the prefill buffers may be generated on a per-pplication basis. A prefill buffer generated for a specific application may include one or more common strings used by the application. In some cases, where multiple prefill buffers are established at a C-SGN, one of the prefill buffers may be designated as a default prefill buffer. The default prefill buffer may include common strings in packet headers and may include an association with an identifier but need not include identifiers associated with strings present in a packet payload. In some cases (e.g., when the payload format of an application is not yet known), the transmitting and receiving devices can use the default prefill buffer to compress and decompress the header of transmitted packets, while leaving the payload of a transmitted packet uncompressed. A transmitting device can, in some cases, choose the default prefill buffer during runtime to compress a packet upon determining that the payload of the packet does not include compressible data. In some cases, different prefill buffers may be established for uplink and downlink communications.

In some cases, the prefill buffers may include a plurality of identifiers associated with known server information, such as destination internet protocol (IP) addresses. While certain fields (e.g. a UE IP address) may be known at the C-SGN, the prefill buffer need not include an identifier associated with the fields (e.g., UE IP address). When a transmitting device generates a compressed packet including, for example, the UE IP address, the transmitting device can indicate the presence of the UE IP address in the packet using an identifier that is not included in the prefill buffers.

The prefill buffers used by a CIoT UE and C-SGN may be fixed in content. Because the contents of the prefill buffers may be fixed, the prefill buffers used by the UE and C-SGN may remain synchronized. Additionally, as the prefill buffers are not updated during communications between the UE and C-SGN, packets may be received in order or out of order. Further, because the contents of the prefill buffers may be fixed, UEs and C-SGNs need not establish prefill buffers after the attach procedure, which may shorten an amount of time needed for context setup. Compression may be applied to the first packet transmitted by a transmitting device using the contents of the prefill buffer identified during the attach procedure.

Figure 5:
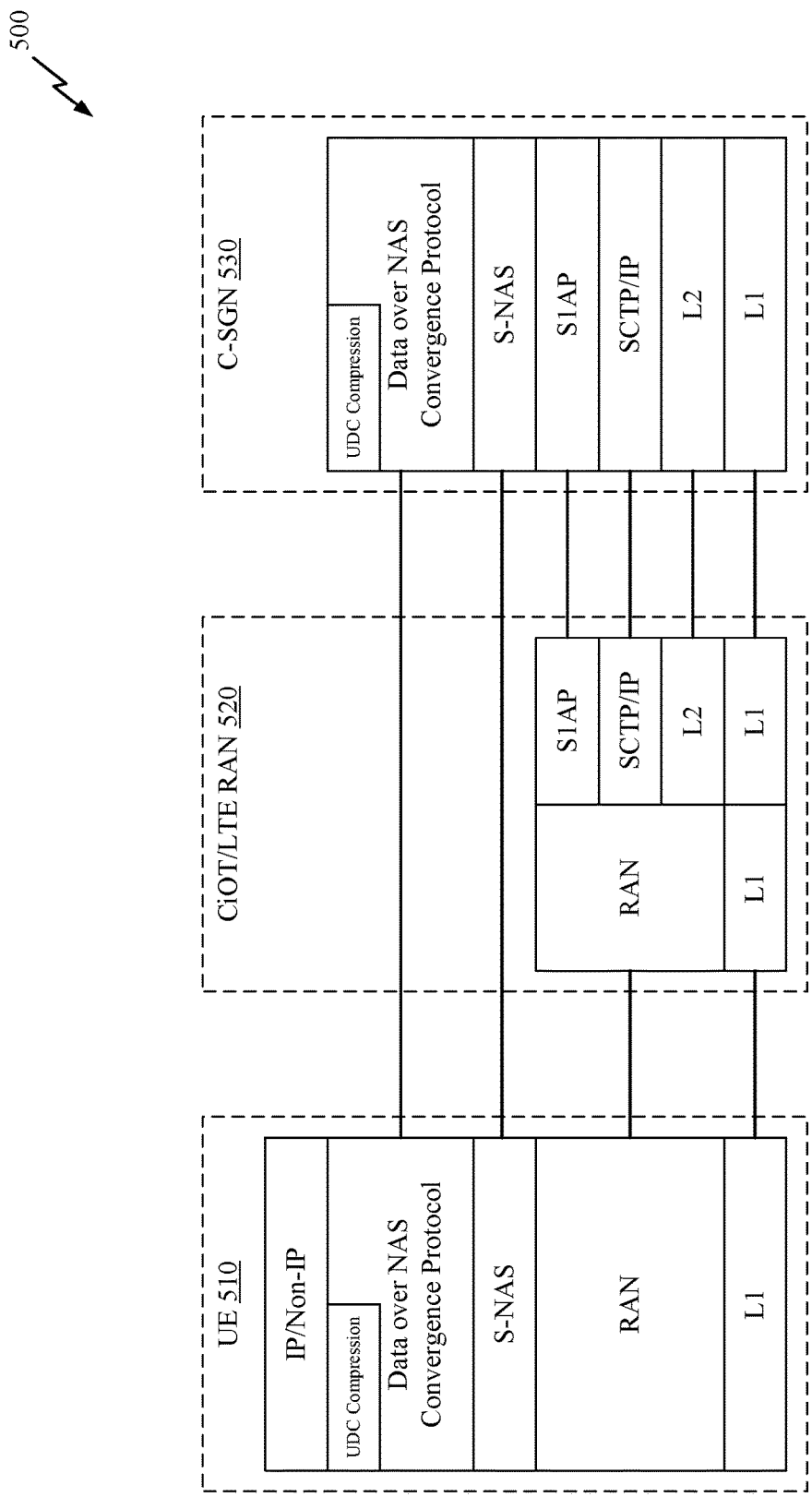
FIG. 5 illustrates an example network architecture for compressing data packets in cellular internet of things (CIoT), in accordance with certain aspects of the present disclosure.

FIG. 5 illustrates an example system architecture 500 for performing compression of packets in CIoT communications, according to an embodiment. As illustrated, an uplink data compressor may be included as part of the data over non-access stratum (NAS) convergence protocol. As discussed above, the uplink data compressor may compress uplink data by using the contents of one or more prefill buffers to replace commonly transmitted strings with identifiers in the prefill buffers, which may reduce the size of a message transmitted from a transmitting device (e.g., UE 510 illustrated in FIG. 5) to a receiving device (e.g., C-SGN 530 illustrated in FIG. 5). At the transmitting device (e.g., UE 510 illustrated in FIG. 5), data compression may be performed on a packet before the packet is encapsulated in an NAS PDU and transmitted to another device. At a receiving device (e.g., C-SGN 530 illustrated in FIG. 5), data decompression may be performed after the receiving device decrypts the data carried in the NAS PDU. To decompress the received packet, C-SGN 530 can search for strings in the one or more prefill buffers corresponding to identifiers included in the received packet. Each identifier may be replaced with the corresponding string from one or more prefill buffers common to one or more UEs as discussed in further detail herein, which allows C-SGN 530 to retrieve the contents of the compressed packet.

Figure 6:
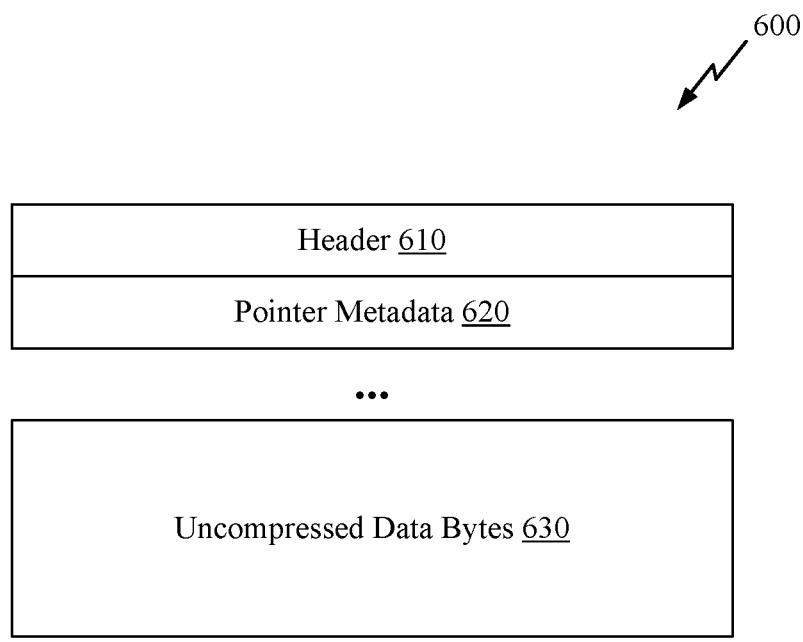
FIG. 6 illustrates an example compressed data packet, in accordance with certain aspects of the present disclosure.

FIG. 6 illustrates a compressed data packet 600, according to an embodiment. As illustrated, the packet includes a header 602, pointer metadata 604, and uncompressed data bytes 606. The header 602 generally indicates if the packet is compressed or not compressed. The pointer metadata 604 generally identifies the location of compressed data in a prefill buffer. The location may include, for example, a memory pointer or another identifier associated with a common string. The data packet may include multiple pointer metadata fields based on the number of strings in the packet that are compressed. Uncompressed data bytes 606 generally follow the pointer metadata. When a receiving device receives a compressed data packet 600, the receiving device examines the pointer metadata 604, if present, to replace the pointer metadata with the corresponding string from the one or more prefill buffers. After the pointer metadata 604 is replaced by the corresponding strings to decompress the compressed data packet, the receiving device can perform subsequent processing of the data transmitted in the compressed packet.

Figure 7:
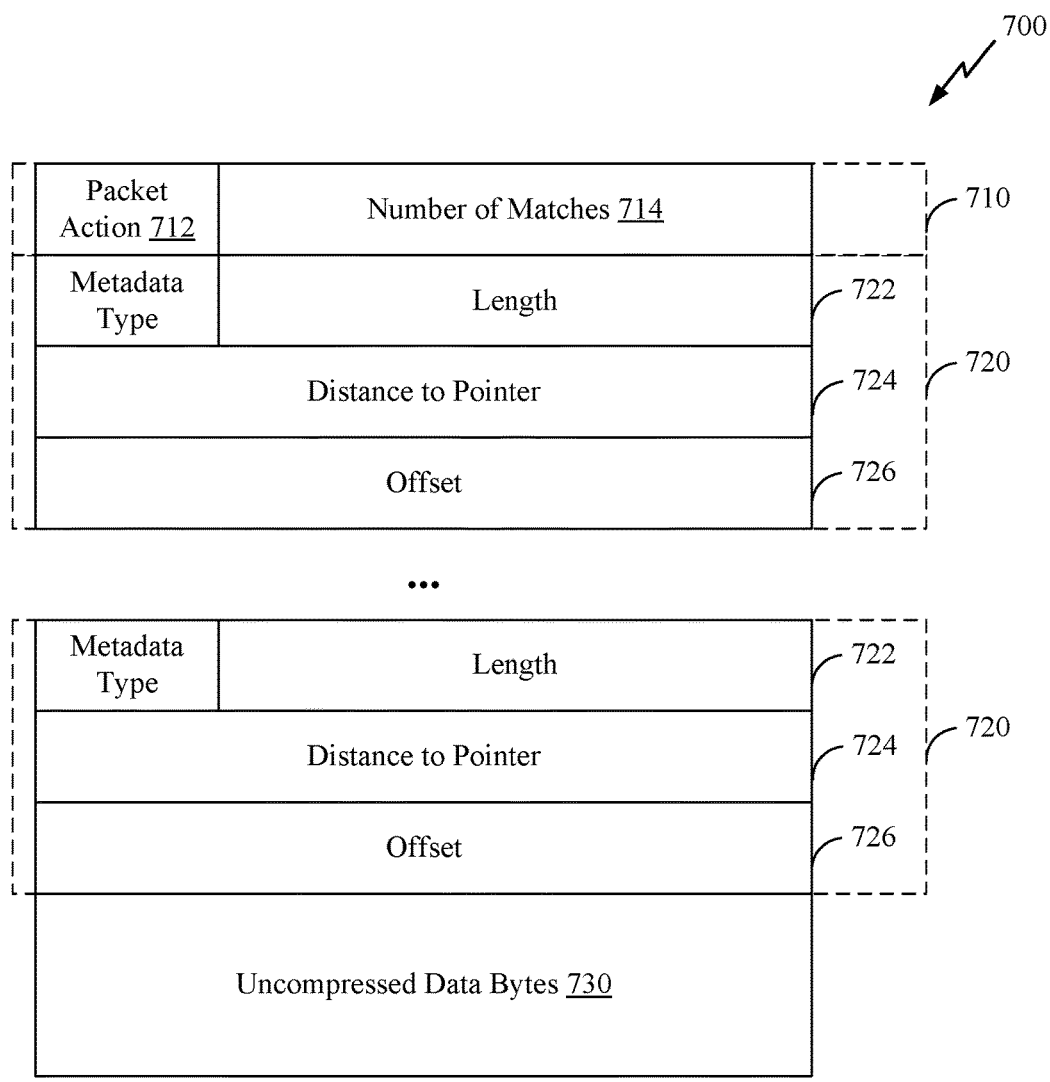
FIG. 7 illustrates an example compressed data packet including a plurality of compressed fields, in accordance with certain aspects of the present disclosure.

FIG. 7 illustrates a compressed data packet 700, according to an embodiment. Compressed data packet 700 generally includes a header 710, a plurality of metadata segments 720, and uncompressed data bytes 730. As illustrated, the header 710 generally includes an indication of whether the packet is compressed in the packet action field 712. The packet action field 712 may include a binary indication of whether the packet is compressed (e.g., that metadata related to a prefill buffer is included in the packet). If the packet is compressed, the header generally includes a second portion 714, which may include data indicating an amount of metadata in the compressed data packet that follows the header.

The metadata segments 720 included in a compressed data packet may be, for example, two or three bytes in length. If the compressed data indicated by a metadata type field is, for example, a UE IP address (that, as discussed above, is not included in a prefill buffer), the metadata may be two bytes in length. The two bytes may include a first byte indicating at least the metadata type. In some cases, the first byte may additionally indicate the length of the data to be inserted into an uncompressed version of the packet. A second byte may indicate where the indicated data (e.g., a UE IP address) is to be inserted into the uncompressed version of the packet.

If the compressed data indicated by the metadata type field is three bytes in length, the metadata segments 720, as illustrated, generally include a first byte 722 indicating the metadata type and the length of the data to be inserted into an uncompressed version of the packet. A second byte 724 may include a distance to a pointer, which indicates where the compressed data is to be inserted in the uncompressed version of the packet. The distance to the pointer may be, for example, a distance from the beginning of the one or more uncompressed data bytes transmitted in the packet after the one or more metadata fields. In some cases, the distance to the pointer may be, for example, a distance relative to a pointer referenced by a previous metadata segment 720 (e.g., with a negative distance indicating that the desired pointer is located before the previously referenced pointer and with a positive distance indicating that the desired pointer is located after the previously referenced pointer). A third byte 726 may be an offset field, which indicates a distance in bytes from the beginning of the prefill buffer that the matching string may be found.

During decompression, for each element of compressed data identified by a metadata segment 720 in compressed data packet 700, a receiving device generally obtains a string from the prefill buffer based on the data carried in the offset field. The receiving device subsequently inserts the string from the prefill buffer into the location in the uncompressed data bytes indicated by the distance to the pointer carried in the metadata included in the compressed data packet. When the packet is fully decompressed, the receiving device can perform subsequent processing of the data transmitted in the compressed packet.

In some cases, a prefill buffer includes a plurality of predefined labels that indicate the fields present in the prefill buffer. Each label may be associated a string and the length of the string.

Figure 8:
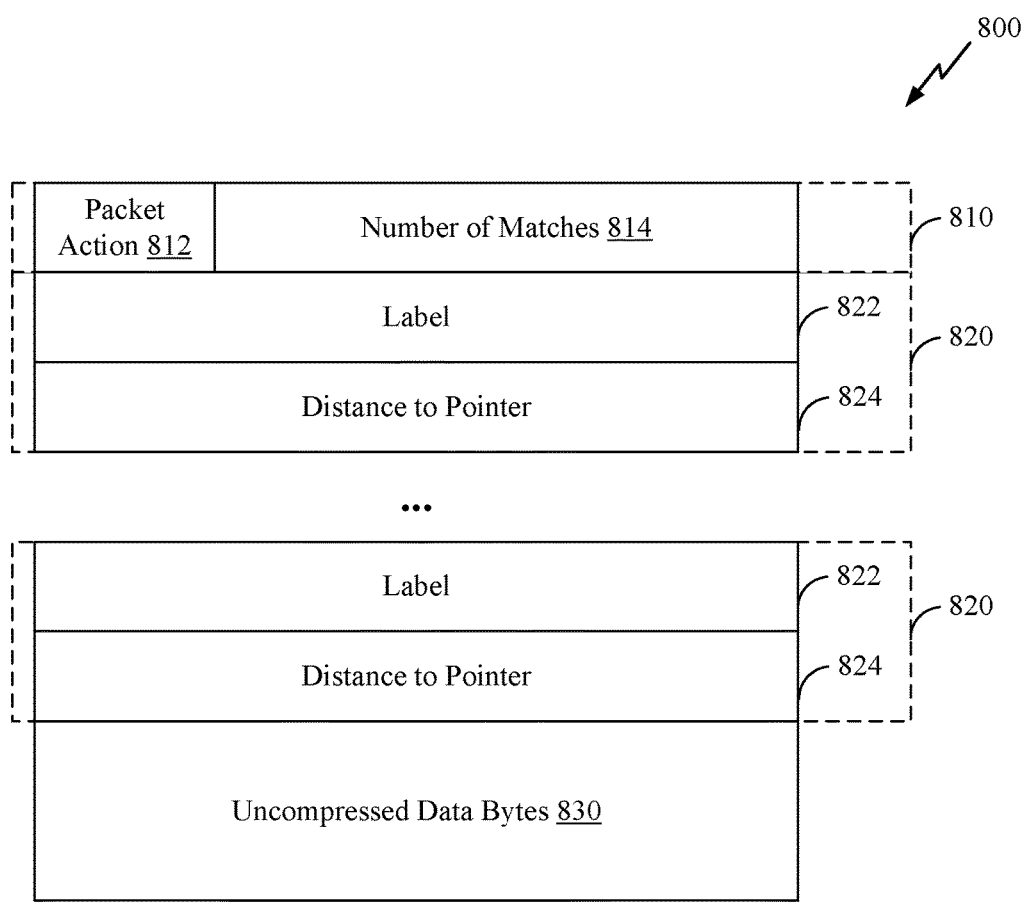
FIG. 8 illustrates an example compressed data packet including a plurality of labels associated with compressed data, in accordance with certain aspects of the present disclosure.

FIG. 8 illustrates an example compressed data packet 800 including a plurality of labels associated with uncompressed data, according to an embodiment. As illustrated, the compressed data packet includes a header 810 indicating whether the packet is compressed and, if so, the number of metadata fields 820 present in the packet, a number of metadata fields 820, and uncompressed data bytes 830.

Each metadata field 820 may include a first byte 822 indicating a label in the prefill buffer and a second byte 824 including a distance to a pointer. The distance to the pointer, as discussed above, indicates a location in the uncompressed data bytes 830 included in the compressed packet that a string retrieved from the prefill buffer is to be inserted. During decompression, a receiving device generally obtains the label identifying a string in one or more prefill buffers from the first byte of the metadata and retrieves the corresponding string and string length associated with the label from the prefill buffer. Upon retrieving the corresponding string and string length from the prefill buffer, the receiving device can insert the string at the location indicated in the distance to pointer field. In some cases, the metadata may include a special label value that indicates that data known at both a compressor (transmitting device) and decompressor (receiving device), such as a UE IP address, is to be inserted into the decompressed packet. In such a case, the receiving device need not access the one or more prefill buffers to obtain a string to insert into the compressed data packet at the location identified by the distance to pointer information carried in second byte 824.

In some cases, the prefill buffers may include a plurality of templates associated with common messages from a particular application. For example, each template can be associated with a sample header format located in the prefill buffer. Values in a transmitted compressed packet that are different from the header format template in the prefill buffer can be filled from data carried in the compressed packet (explicitly), indicated as a special field (e.g., for the UE IP address), or filled from another portion of the prefill buffer.

Figure 9:
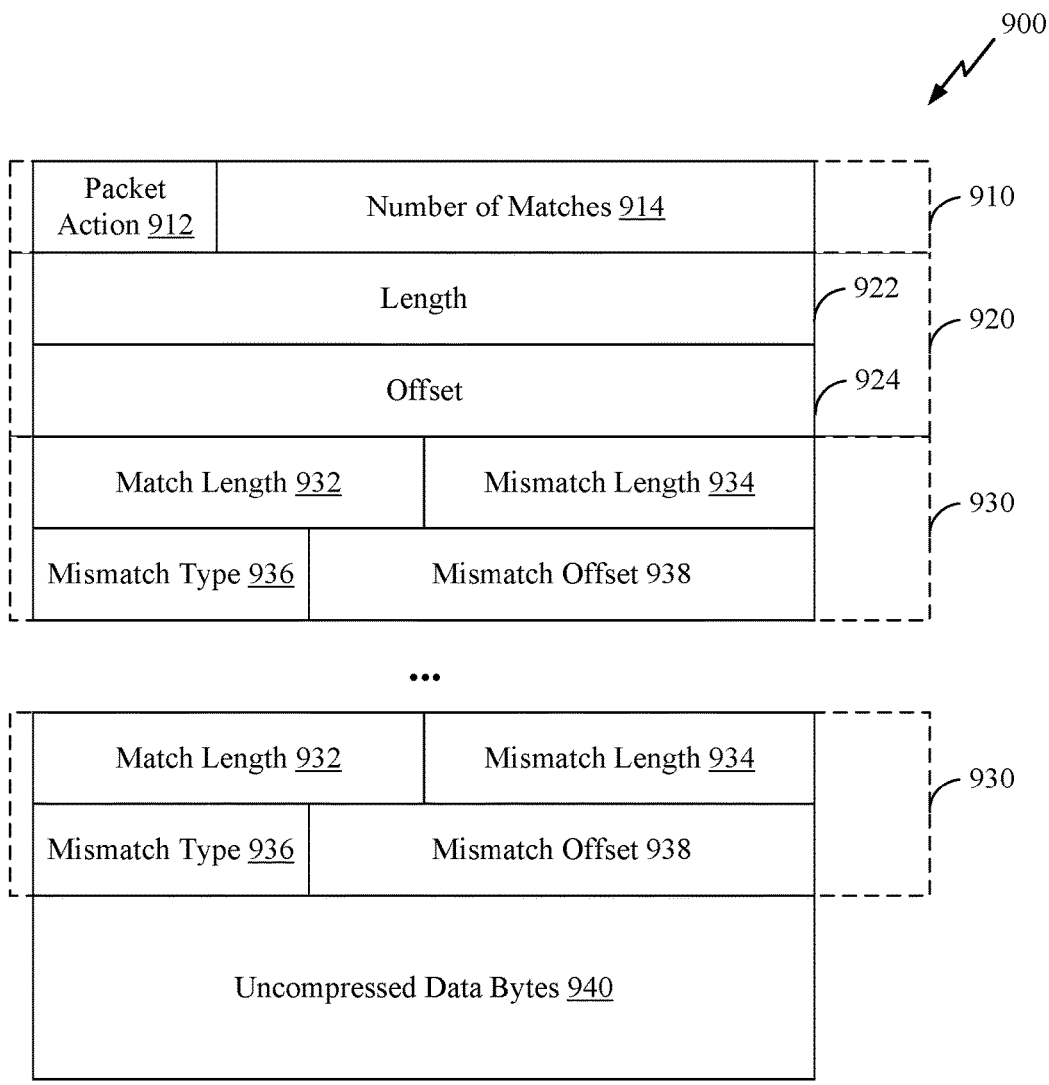
FIG. 9 illustrates an example compressed data packet including an indication of a data template to use in decompressing the compressed data packet, in accordance with certain aspects of the present disclosure.

FIG. 9 illustrates an example compressed data packet 900 including an indication of a template, according to an embodiment. As illustrated, the compressed data packet includes a header 910 indicating whether the packet is compressed and, if so, the number of metadata fields 930 present in the packet. Following the header, the packet includes a template indicator 920, which indicates the template associated with the compressed data packet that the decompressing device is to retrieve from the prefill buffer. In some cases, the template indicator 920 may include two bytes to indicate the length of the template and the beginning location of the template in the prefill buffer. In some cases, the indication of the template may include a byte to indicate a template identifier.

Each metadata field 930 generally includes a match length 932, mismatch length 934, mismatch type 936, and mismatch offset 938. The match length 932 indicates the length of the matched block in the indicated template, and the mismatch length 934 indicates the length of the block that is to be replaced by other data. The mismatch type 936 generally indicates where the replacement data may be found. If the mismatch type indicates (e.g., using the two-bit value of "00") that the replacement data may be found in another location in the prefill buffer, the mismatch offset generally indicates where in the prefill buffer the replacement data may be found. A decompressor can locate the replacement data using the mismatch offset and mismatch length and replace the mismatching data in the template with the replacement data.

If the mismatch type 936 indicates (e.g., using the two-bit value of "01") that the data field is a special field to be filled by a quantity known at both the compressor (transmitting device) and decompressor (receiving device), such as a UE IP address, the decompressor need not access a prefill buffer or the uncompressed data bytes to obtain the data to insert into the template. The decompressor can insert the corresponding quantity (e.g., the UE IP address) directly into the template.

In some cases, replacement data may be carried explicitly in uncompressed data bytes 940 following the metadata. In such a case, the mismatch type may indicate (e.g., using the two-bit value of "10") that the replacement data is located in the uncompressed data bytes 940. A decompressor can locate the replacement data in the uncompressed data bytes 940 and replace the mismatching data in the template with the replacement data.

The frame formats illustrated in FIGS. 6-9 illustrate non-limiting examples of frame formats that may be used to carry compressed data in CIoT communications and are not to be considered limiting of its scope. Similar formats may be established and used to carry compressed data in CIoT communications.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various operations of methods described above may be performed by any suitable means capable of performing the operations, such as various hardware and/or software component(s), circuits, and/or module(s). Generally, any operations illustrated in the Figures may be performed by corresponding functional means capable of performing the operations.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk and Blu-ray® disc where disks usually reproduce data magnetically, while discs reproduce data optically with lasers.

Thus, certain aspects may comprise a computer program product for performing the operations presented herein. For example, such a computer program product may comprise a computer readable medium having instructions stored (and/or encoded) thereon, the instructions being executable by one or more processors to perform the operations described herein. For certain aspects, the computer program product may include packaging material.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

While the foregoing is directed to aspects of the present disclosure, other and further aspects of the disclosure may be devised without departing from the basic scope thereof, and the scope thereof is determined by the claims that follow.

What is claimed is:

1. A method, comprising:
  establishing at least a first prefill buffer common to a first set of UEs, wherein the first prefill buffer includes a plurality of common strings;
  generating a compressed packet, wherein generating the compressed packet includes:
    identifying matches to at least one of the plurality of common strings in at least one of a header portion or payload portion of an uncompressed packet,
    associating identifiers with the at least one matched common string of the plurality of common strings, wherein an identifier of the identifiers comprises: a type of a compressed field; a length of data represented by the compressed field; a location in uncompressed data at which the common string associated with the identifier is to be inserted; or a location of the common string associated with the identifier in the prefill buffer, and
    removing the at least one matched common string of the plurality of common strings from the uncompressed packet; and transmitting the compressed packet.

2. The method of claim 1, wherein the compressed packet comprises an indication that the compressed packet is a compressed packet.

3. The method of claim 1, wherein at least one matched common string of the plurality of common strings comprises one or more of a destination internet protocol (IP) address or a string used by a particular application.

4. The method of claim 1, wherein establishing at least a first prefill buffer comprises:
  establishing at least the first prefill buffer for uplink communications; and
  establishing at least a second prefill buffer for downlink communications.

5. The method of claim 1, wherein the at least the first prefill buffer is fixed in content.

6. The method of claim 1, further comprising:
  establishing a second prefill buffer common to a second set of UEs, wherein the first prefill buffer is associated with a first buffer identifier and the second prefill buffer is associated with a second buffer identifier.

7. The method of claim 6, further comprising:
  during an attach procedure with a UE, transmitting the first buffer identifier or the second buffer identifier to the UE based on whether the first prefill buffer or the second prefill buffer is to be used in generating the compressed packet.

8. The method of claim 6, wherein the first and second buffer identifiers comprise a checksum of the respective prefill buffers.

9. The method of claim 6, wherein the first prefill buffer comprises associations of common strings for data carried in a packet header to corresponding identifiers.

10. The method of claim 9, wherein the first prefill buffer is designated as a default prefill buffer to be used for unknown applications.

11. The method of claim 9, further comprising:
  upon determining that the payload of the uncompressed packet does not include compressible data, compressing the header of the uncompressed packet using the first prefill buffer.

12. The method of claim 1, wherein an identifier of the identifiers comprises:
  information identifying the common string associated with the identifier in the prefill buffer; and
  a location in uncompressed data at which the common string associated with the identifier is to be inserted.

13. The method of claim 1, wherein:
  the compressed packet comprises an indication of a template and a length of the template, wherein the template specifies content of a message and content to be inserted into the message from the compressed packet; and
  the identifiers comprise:
    a number of bytes to retrieve from the template;
    a number of bytes not included in the template; and
    a location of the bytes not included in the template to concatenate with the number of bytes retrieved from the template.

14. The method of claim 13, wherein the location of the bytes not included in the template comprises at least one of a location of the bytes in uncompressed data or a location of the bytes in the first prefill buffer.

15. The method of claim 1, wherein the identifiers comprise an indication of a value known to a transmitting device and a receiving device and not included in the first prefill buffer.

16. The method of claim 15, wherein the value known to the transmitting device and not included in the first prefill buffer comprises an internet protocol (IP) address of the transmitting device.

17. The method of claim 1, wherein transmitting the compressed packet comprises transmitting the compressed packet via a non-access stratum (NAS) protocol data unit (PDU).

18. A method, comprising:
  receiving configuration information including a prefill buffer common to a first set of UEs;
  receiving a compressed packet, wherein the compressed packet includes at least one identifier corresponding to a common string;
  retrieving the common string from the prefill buffer common to the first set of UEs, using the at least one identifier; and
  processing the compressed packet, wherein processing the compressed packet includes:
    decoding a type of compressed field, a length of data represented by the compressed field, a location in uncompressed data at which the common string is to be inserted, or a location of the common string in the prefill buffer; and
    replacing, at the location in uncompressed data, the identifier with the common string retrieved from the prefill buffer.

19. The method of claim 18, wherein the compressed packet comprises an indication that the compressed packet is a compressed packet.

20. The method of claim 18, wherein the common string comprises at least one of a destination internet protocol (IP) address or a string used by a particular application.

21. The method of claim 18, wherein processing the compressed packet comprises selecting the prefill buffer from a plurality of buffers based on an indication of the prefill buffer during a UE attach procedure.

22. The method of claim 21, wherein the indication of the prefill buffer comprises a checksum of the prefill buffer.

23. The method of claim 18, wherein the prefill buffer is fixed in content.

24. The method of claim 18, wherein processing the compressed packet comprises:
  decoding an identifier of the common string in the prefill buffer and a location in uncompressed data at which the common string is to be inserted; and
  replacing, at the location in uncompressed data, the identifier with the common string retrieved from the prefill buffer.

25. The method of claim 18, wherein processing the compressed packet comprises:
  obtaining, from the prefill buffer, a template based on an indication of a template and a length of the template included in the compressed packet; and
  generating one or more data fields in the compressed packet based on an indication of a number of bytes to retrieve from the template, a number of bytes not included in the template, and a location of the bytes not included in the template to concatenate with the number of bytes retrieved from the template.

26. The method of claim 25, wherein the location of the bytes not included in the template comprises one of a location of the bytes in uncompressed data or a location of the bytes in the prefill buffer.

27. An apparatus, comprising:
a processing system configured to:
- establish at least one prefill buffer common to a first set of UEs, wherein the prefill buffer includes a plurality of common strings; and
- generate a compressed packet by:
    - identifying matches to one or more of the common strings in at least one of a header portion or payload portion of an uncompressed packet,
    - associating identifiers with the one or more matched common string of the plurality of common strings, wherein an identifier of the identifiers comprises: a type of a compressed field; a length of data represented by the compressed field; a location in uncompressed data at which the common string associated with the identifier is to be inserted; or a location of the common string associated with the identifier in the prefill buffer,
    - removing the one or more matched common string of the one or more common strings from the uncompressed packet; and
a transmitter configured to transmit the compressed packet.

28. An apparatus, comprising:
a receiver configured to receive:
- configuration information including a prefill buffer common to a first set of UEs, and
- a compressed packet, wherein the compressed packet includes at least one identifier corresponding to a common string; and
a processor configured to process the compressed packet by:
- retrieving the common string from the prefill buffer common to the first set of UEs, using the at least one identifier;
- decoding a type of compressed field, a length of data represented by the compressed field, a location in uncompressed data at which the common string is to be inserted, or a location of the common string in the prefill buffer; and
- replacing, at the location in uncompressed data, the identifier with the common string retrieved from the prefill buffer.

* * * * *